United States Patent
Hatsch et al.

(12)

(10) Patent No.: US 7,487,198 B2
(45) Date of Patent: Feb. 3, 2009

(54) MULTIBIT BIT ADDER

(75) Inventors: Joel Hatsch, Unterhaching (DE); Winfried Kamp, München (DE)

(73) Assignee: Infineon Technologies AG, Munich (DE)

( * ) Notice: Subject to any disclaimer, the term of this patent is extended or adjusted under 35 U.S.C. 154(b) by 741 days.

(21) Appl. No.: 10/961,521

(22) Filed: Oct. 8, 2004

(65) Prior Publication Data

US 2005/0114424 A1    May 26, 2005

(30) Foreign Application Priority Data

Oct. 10, 2003    (DE) ............................... 103 47 077

(51) Int. Cl.
    *G06F 7/50*    (2006.01)
(52) U.S. Cl. ...................... 708/708; 708/709
(58) Field of Classification Search .................. 708/708, 708/709
    See application file for complete search history.

(56) References Cited

U.S. PATENT DOCUMENTS

| | | | |
|---|---|---|---|
| 5,347,482 A * | 9/1994 | Williams | 708/625 |
| 5,471,413 A | 11/1995 | Sali et al. | |
| 6,345,286 B1 * | 2/2002 | Dhong et al. | 708/708 |
| 6,578,063 B1 * | 6/2003 | Kojima et al. | 708/708 |

FOREIGN PATENT DOCUMENTS

| | | |
|---|---|---|
| DE | 692 06 604 T2 | 5/1996 |
| DE | 101 30 484 A1 | 9/2002 |
| EP | 0 514 061 A2 | 11/1992 |

\* cited by examiner

*Primary Examiner*—Chuong D Ngo
(74) *Attorney, Agent, or Firm*—Maginot, Moore & Beck

(57) ABSTRACT

The invention relates to an adder for adding at least four bits of the same significance w, said adder having a first number of inputs for receiving the bits of the same significance w that are to be added and a number of outputs, the bits to be added being applied to the inputs in presorted form, and the adder adding the bits while taking account of the presorting. The invention also provides an adding device for adding at least four bits of equal significance and a corresponding method.

22 Claims, 12 Drawing Sheets

FIG 1

|  | AQ' | BQ' | CQ' |  | AQ | BQ | CQ |  |
|---|---|---|---|---|---|---|---|---|
| Z7' | 1 | 1 | 1 |  | 1 | 1 | 1 | Z3 |
| Z6' | 1 | 1 | 0 |  | 1 | 1 | 0 | Z2 |
| Z5' | 1 | 0 | 1 |  | 1 | 1 | 0 | Z2 |
| Z4' | 1 | 0 | 0 |  | 1 | 0 | 0 | Z1 |
| Z3' | 0 | 1 | 1 |  | 1 | 1 | 0 | Z2 |
| Z2' | 0 | 1 | 0 |  | 1 | 0 | 0 | Z1 |
| Z1' | 0 | 0 | 1 |  | 1 | 0 | 0 | Z1 |
| Z0' | 0 | 0 | 0 |  | 0 | 0 | 0 | Z0 |

FIG 2

| AQ | BQ | CQ | XQ | YQ | ZQ | NQ | | C2Q | C1Q | C0Q | SQ |
|----|----|----|----|----|----|----|----|----|----|----|----|
| 1 | 1 | 1 | 1 | 1 | 1 | 1 | | 1 | 1 | 1 | 1 |
| 1 | 1 | 1 | 1 | 1 | 1 | 0 | | 1 | 1 | 1 | 0 |
| 1 | 1 | 1 | 1 | 1 | 0 | 1 | | 1 | 1 | 1 | 0 |
| 1 | 1 | 1 | 1 | 1 | 0 | 0 | | 1 | 1 | 0 | 1 |
| 1 | 1 | 1 | 1 | 0 | 0 | 1 | | 1 | 1 | 0 | 1 |
| 1 | 1 | 1 | 1 | 0 | 0 | 0 | | 1 | 1 | 0 | 0 |
| 1 | 1 | 1 | 0 | 0 | 0 | 1 | | 1 | 1 | 0 | 0 |
| 1 | 1 | 1 | 0 | 0 | 0 | 0 | | 1 | 0 | 0 | 1 |
| 1 | 1 | 0 | 1 | 1 | 1 | 1 | | 1 | 1 | 1 | 0 |
| 1 | 1 | 0 | 1 | 1 | 1 | 0 | | 1 | 1 | 0 | 1 |
| 1 | 1 | 0 | 1 | 1 | 0 | 1 | | 1 | 1 | 0 | 1 |
| 1 | 1 | 0 | 1 | 1 | 0 | 0 | | 1 | 1 | 0 | 0 |
| 1 | 1 | 0 | 1 | 0 | 0 | 1 | | 1 | 1 | 0 | 0 |
| 1 | 1 | 0 | 1 | 0 | 0 | 0 | | 1 | 0 | 0 | 1 |
| 1 | 1 | 0 | 0 | 0 | 0 | 1 | | 1 | 0 | 0 | 1 |
| 1 | 1 | 0 | 0 | 0 | 0 | 0 | | 1 | 0 | 0 | 0 |
| 1 | 0 | 0 | 1 | 1 | 1 | 1 | | 1 | 1 | 0 | 1 |
| 1 | 0 | 0 | 1 | 1 | 1 | 0 | | 1 | 1 | 0 | 0 |
| 1 | 0 | 0 | 1 | 1 | 0 | 1 | | 1 | 1 | 0 | 0 |
| 1 | 0 | 0 | 1 | 1 | 0 | 0 | | 1 | 0 | 0 | 1 |
| 1 | 0 | 0 | 1 | 0 | 0 | 1 | | 1 | 0 | 0 | 1 |
| 1 | 0 | 0 | 1 | 0 | 0 | 0 | | 1 | 0 | 0 | 0 |
| 1 | 0 | 0 | 0 | 0 | 0 | 1 | | 1 | 0 | 0 | 0 |
| 1 | 0 | 0 | 0 | 0 | 0 | 0 | | 0 | 0 | 0 | 1 |
| 0 | 0 | 0 | 1 | 1 | 1 | 1 | | 1 | 1 | 0 | 0 |
| 0 | 0 | 0 | 1 | 1 | 1 | 0 | | 1 | 0 | 0 | 1 |
| 0 | 0 | 0 | 1 | 1 | 0 | 1 | | 1 | 0 | 0 | 1 |
| 0 | 0 | 0 | 1 | 1 | 0 | 0 | | 1 | 0 | 0 | 0 |
| 0 | 0 | 0 | 1 | 0 | 0 | 1 | | 1 | 0 | 0 | 0 |
| 0 | 0 | 0 | 1 | 0 | 0 | 0 | | 0 | 0 | 0 | 1 |
| 0 | 0 | 0 | 0 | 0 | 0 | 1 | | 0 | 0 | 0 | 1 |
| 0 | 0 | 0 | 0 | 0 | 0 | 0 | | 0 | 0 | 0 | 0 |

FIG 7c

MULTIBIT BIT ADDER

The invention relates to a device and a method for adding a plurality of bits of equal significance. The invention relates, in particular, to an adder having a small number of controllable paths between an output and a supply voltage.

BACKGROUND

Adders are known in the art and are generally used to add a particular number of bits of equal significance, with the sum value (in the form of a sum bit) and a particular number of requisite carry bits being output. By way of example, "three-to-two bit full adders" are known, said adders having three inputs for receiving three bits of equal significance w and two outputs for outputting a sum bit of significance w and a carry bit of significance 2w. In this case, the sum bit of significance w indicates the parity of the sum of the three input bits of significance w, and the carry bit indicates the carry of significance 2w. Further carry outputs are required if more than three bits of equal significance are to be added. In order to make the most efficient use possible of the representational space for the carry bits, it is appropriate to output a sum bit and two carry bits of significance 2w and 4w when adding seven bits of equal significance.

EP 0514061 describes a "seven-to-three bit adder". In this case, the input bits of equal significance that are to be added are routed to the outputs through six logic gate stages.

The present invention is now based on the object of providing a simple multibit adder. In particular, the adder is to require little implementation complexity and is to have particularly short signal propagation times and a low power consumption.

SUMMARY

According to the invention, this object is achieved by means of an adder, an adding device and a corresponding method.

Accordingly, an adder for adding at least four bits of equal significance is provided, said adder having a first number of inputs for receiving the bits of significance w that are to be added and having a second number of outputs, the bits to be added being applied to the inputs in presorted form, and the adder adding the bits to be added while taking account of the presorting.

An adding device for adding at least four bits of the same significance is furthermore provided, said adding device having at least one first adder and one first sorter, with the sorter being connected upstream of the adder and presorting the bits to be added.

A method for adding at least four bits of equal significance is also provided, said method having the following method steps:
(a) providing at least four bits of significance w that are to be added,
(b) presorting the bits to be added,
(c) calculating the sum and carry using the presorting,
(d) outputting a sum bit, and
(e) outputting at least two carry bits.

Efficiently presorting the bits to be added in the inventive adder or method and calculating the sum and carries using the presorting make it possible to greatly reduce the circuit complexity in comparison with adders based on the prior art. This is highly advantageous, in particular, when a plurality of inventive adders are connected in series.

Since, in comparison with seven-bit adders based on the prior art, for example, fewer controllable paths are required, an inventive adder has a particularly high switching speed and a low power consumption.

In one preferred embodiment of the inventive adder, the number of inputs corresponds to the number of bits to be added, and the number of outputs has been selected in such a manner that the addition's parity and carry can be represented in full. In particular, the inventive adder advantageously has at least six inputs and at least three outputs for six bits to be added.

In another preferred embodiment of the inventive adder, a sum bit of significance w is applied to a first output, and carry bits of significance 2w and 4w are applied to a second and a third output. Selecting the significances 2w and 4w at the second and third outputs makes full use of the representational space for the addition's carry.

In yet another preferred embodiment of the inventive adder, one output is provided for outputting a sum bit of significance w, and second, third and fourth outputs are provided for outputting carry bits of significance 2w.

Outputting the carry in the form of three carry bits of equal significance 2w advantageously makes it possible to sort the carry bits in a particularly efficient manner. This makes it possible to route the carry to further adders according to the invention and thus to carry out a further addition using the presorting.

In a preferred presorting operation, the bits to be added have always been presorted in such a manner that the same logic levels are applied at least to two adjacent inputs of three adjacent inputs of the adder. This preferred presorting operation also makes it possible to advantageously supply the adder with the three carry bits from an inventive addition of less significance, said bits being present in such sorted form.

In one particularly preferred embodiment of the adder, the adder has three first inputs, three second inputs and a third input. The bits to be added are always present at the three first and three second inputs in presorted form in such a manner that the same logic levels are applied at least to two adjacent inputs of the first three and the second three inputs. A seventh bit to be added is then applied to the third input.

This particularly preferred embodiment of the inventive adder makes it possible for the circuit complexity to be achieved to a maximum of five controlled paths of controllable switches in series between one of the outputs and a supply connection. These controlled paths form only two logic gates. As a result, the signal propagation time is considerably shorter than in seven-bit adders based on the prior art, which have at least six logic gates between an output and a supply connection. In addition, this preferred embodiment of the inventive adder is distinguished by its low power consumption. It is furthermore advantageous that the adder may be in the form of a carry-save adder.

One preferred development of the invention provides an adding device for adding at least four bits of the same significance w, said adding device having at least one first inventive adder and one first sorter which is connected upstream of the adder and presorts the bits to be added.

This has the advantage that even bits to be added that have not been presorted at the input can be added quickly and without a great deal of circuit complexity, in accordance with the invention, by the inventive adding device.

One particularly preferred development of the adding device provides two sorters which each have three inputs and three outputs and are connected upstream of six inputs of the adder. In this case, the sorters presort the bits to be added. Three carry bits of the same significance 2w can thus advantageously be routed to one of the two sorters. This makes it possible for the inventive adding device also to be used in combination with conventional adders which provide carry bits.

Another preferred development of the adding device provides further adders for adding bits of the significance of multiples of 2w, said further adders being connected in cascade to one another. In this case, the three carry outputs—of significance 2w—of the first adder are coupled to inputs of the second adder which performs adding of significance 2w. The adders are advantageously part of an integrated circuit. The cascaded embodiment of the inventive adding device makes particularly efficient use of the advantageous short switching time and low power consumption of the adders.

In one advantageous refinement of the inventive method for adding at least six bits of equal significance, the bits to be added are presorted in such a manner that three first bits are combined to form a first group, three further bits are combined to form a second group, and the eight combinations—or states—of bits from each group which result in the same sum are assigned to four subgroups.

The three bits in each group may have eight different combinations. Each combination is assigned to a subgroup, with each combination in the same subgroup giving the same addition result. That is to say only four subgroups are relevant to the inventive addition. The addition is therefore simplified in the case of such an advantageous presorting operation. Moreover, an addition table which has been reduced from $2^7=128$ "conventional states" to 32 "inventive states" may be specified on the basis of the subgroups.

The subclaims specify further advantageous refinement of the invention.

BRIEF DESCRIPTION OF THE DRAWINGS

The invention is described below using exemplary embodiments and with reference to the drawings, in which:

FIG. 1: shows a sorting table for an inventive sorter,

FIG. 2: shows an inventive addition table,

FIGS. 7*a-d:* show a preferred embodiment of the adder's summing circuit and carry bit circuits.

DETAILED DESCRIPTION

Figure 3:
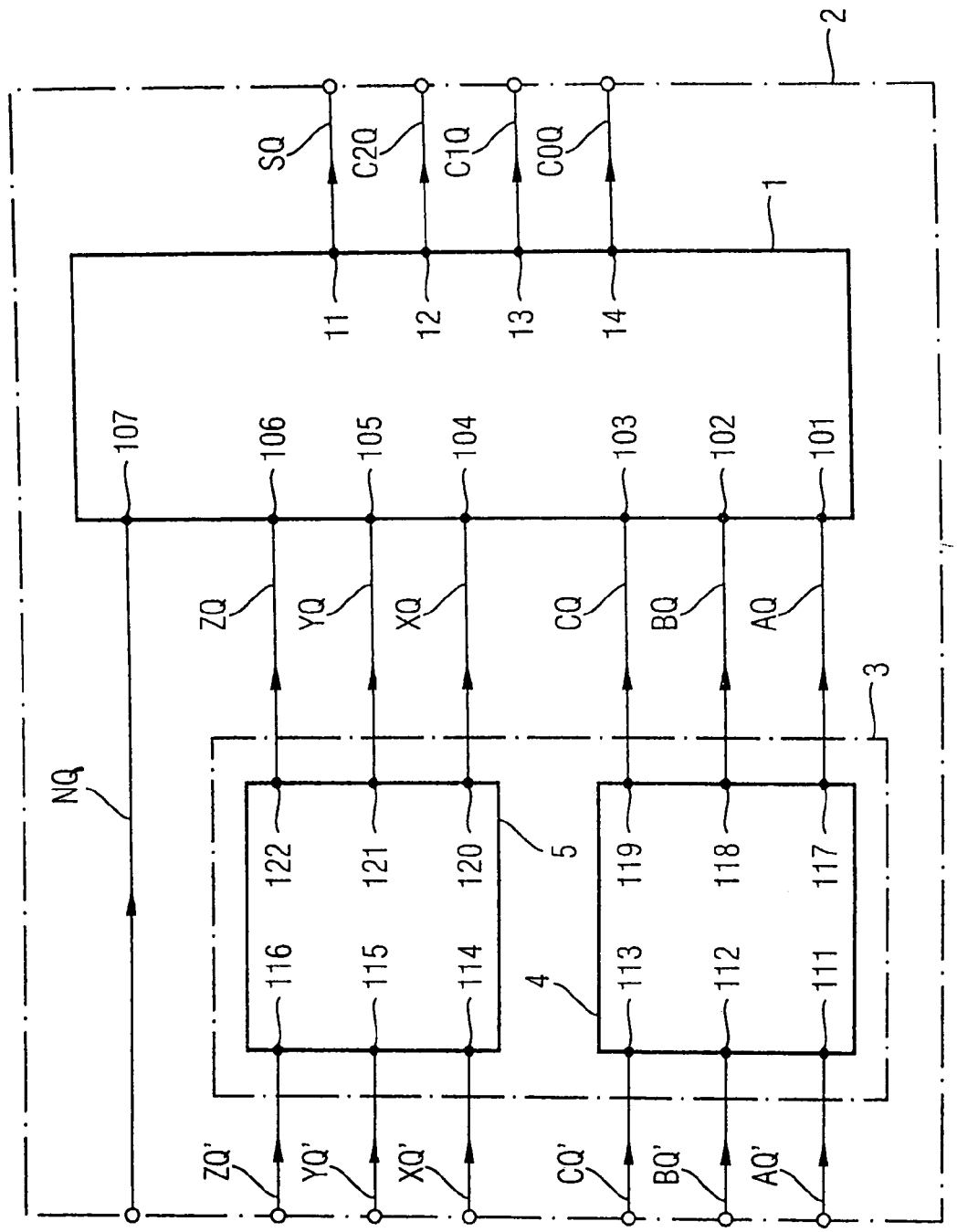
FIG. 3: shows a block diagram of the inventive adding device.

FIG. 1 describes the sorting of three bits AQ', BQ', CQ' of equal significance. The three bits AQ', BQ', CQ' may be present in eight combinations or states Z0'-Z7'. The task of an inventive sorter is to sort these three bits in an appropriate manner for efficient addition. Since, in the case of addition, only the number of bits which have been set is relevant but not their position at the inputs of an adder, the eight combinations Z0'-Z7' may be mapped to only four relevant combinations Z0-Z3 that are equivalent for the purposes of summation. The number of possible states for three bits to be added is thus reduced from eight to four.

The task of a sorter is to provide the bits AQ', BQ', CQ' (which are unsorted at the input) in the form of sorted bits AQ, BQ, CQ at the output. In concrete terms, in the table shown in FIG. 1, the sorting operation shifts the bits AQ', BQ', CQ' which have been set at the input "to the left" and shifts bits which have not been set "to the right". By way of example, the state Z3', in which AQ'=0, BQ'=1 and CQ'=1, is changed to the sorted state Z2, where AQ=1, BQ=1 and CQ=0. The other combinations Z0'-Z7' may be sorted in a corresponding manner. The fact that only the sorted bits AQ, BQ, CQ are consequently used for further addition makes it possible to design an addition table which is matched to the sorting and in which the number of combinations for the bits to be added is greatly reduced.

FIG. 2 shows an inventive addition table for adding seven presorted input bits AQ, BQ, CQ, XQ, YQ, ZQ, NQ of significance w. In accordance with the sorting table shown in FIG. 1, the bits AQ, BQ, CQ, XQ, YQ, ZQ, NQ to be added have been presorted into two groups of three comprising AQ, BQ, CQ and XQ, YQ, ZQ. The columns C2Q, C1Q and C0Q contain carry bits of significance 2w. Instead of the carry being conventionally coded into two carry bits of significance 2w and 4w, a format having three carry bits of significance 2w has been chosen. The carry is therefore compatible with the groups of three input bits for an addition of more significance. The sum bit of significance w is labeled SQ.

In each row of the table shown in FIG. 2, a state corresponds to the seven bits AQ, BQ, CQ, XQ, YQ, ZQ, NQ of significance w that are to be added and also to the corresponding addition result SQ, C0Q, C1Q, C2Q. As shown in the addition table, the carry bits C0Q, C1Q, C2Q of significance 2w are also present in presorted form, that is to say carry bits which have been set are on the left and those which have not been set are on the-right. Since both the three first bits AQ, BQ, CQ to be added and the three second bits XQ, YQ, ZQ to be added are present in presorted form, only 32 states or combinations need to be taken into account for the addition. If there were seven bits to be added which had not been presorted, $2^7=128$ combinations of input bits would have to be taken into account.

The sorting scheme in accordance with which the three first bits AQ, BQ, CQ of significance w that are to be added, the three second bits XQ, YQ, ZQ of significance w that are to be added and the carry bits C0Q, C1Q and C2Q have been sorted can also be described in such a manner that the same logic states are present for at least two adjacent bits in the groups of three bits AQ, BQ, CQ; XQ, YQ, ZQ; C0Q, C1Q, C2Q.

Reducing the possible combinations of input bits AQ, BQ, CQ, XQ, YQ, ZQ, NQ of significance w that are to be added means that, in a circuit implementation of the addition table shown in FIG. 2, only a maximum of five transistors or five controlled paths of controllable switches are arranged in series in a critical path, that is to say between an input and an output to which the carry bits C0Q, C1Q, C2Q or the sum bit SQ is/are applied.

FIG. 3 shows a block diagram of the inventive adding device 2 for adding seven bits AQ', BQ', CQ', XQ', YQ', ZQ', NQ of equal significance w, the first six bits AQ', BQ', CQ', XQ', YQ', ZQ' of significance w that are to be added being presorted according to the invention by a sorter 3.

The sorter 3 has two sorters 4, 5, each having three inputs 111-116 for respectively receiving three of the bits AQ', BQ', CQ'; XQ', YQ', ZQ' to be added, and supplies sorted bits at the outputs 117-122, the first three outputs 117, 118, 119 being parts of the first sorter 4 and supplying the first three presorted bits AQ, BQ, CQ. The second three outputs 120, 121, 122 are parts of the second sorter 5 and supply the second three presorted bits XQ, YQ, ZQ.

The outputs 117-122 of the sorters 4, 5 are coupled to the inputs 101-106 of the adder. The bits AQ, BQ, CQ, XQ, YQ, ZQ, NQ to be added which have been presorted according to the invention are applied to the inputs 101-107 of an inventive adder 1 which supplies the sum bit from the addition SQ and three carry bits C0Q, C1Q, C2Q of significance 2w at four outputs 11-14.

The carry bits at the outputs 12-14 for the carry bits C0Q, C1Q, C2Q have already been sorted in accordance with the addition table shown in FIG. 2.

Figure 4:
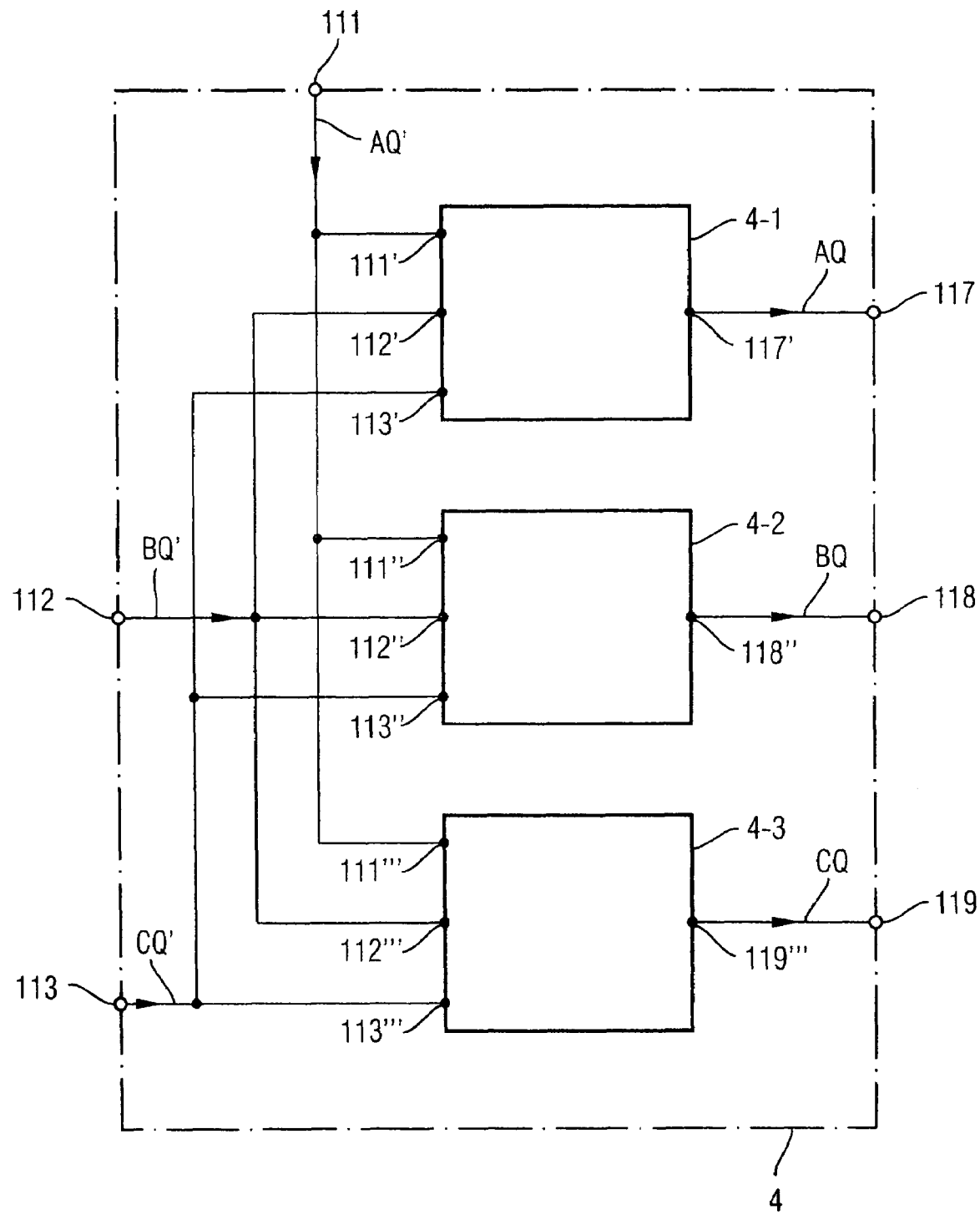
FIG. 4: shows a block diagram of an inventive sorter.

FIG. 4 shows a block diagram of an inventive sorter 4. The sorter has three inputs 111, 112, 113 to which three unsorted bits AQ', BQ', CQ' of the seven bits to be added are applied. The three sorted bits AQ, BQ, CQ to be added are applied to the three outputs 117, 118, 119 of the sorter 4. The sorter 4 has three circuit blocks 4-1, 4-2, 4-3 which each have three inputs 111', 112', 113'; 111", 112", 113"; 111''', 112''', 113''' and are coupled to the inputs 111, 112, 113 of the sorter 4, with the result that the three unsorted bits AQ', BQ', CQ' to be added are applied to each circuit block 4-1, 4-2, 4-3. Each of the circuit blocks 4-1, 4-2, 4-3 has an output 117', 118", 119''', the output 117' of the first circuit block 4-1 supplying the first sorted bit AQ to the output of the sorter, the second output 118" of the second circuit block 4-2 supplying the second sorted bit BQ to the output 118 of the sorter 4, and the third output 119''' of the third circuit block 4-3 supplying the third sorted bit CQ to the output 119 of the sorter 4.

Figure 5A:
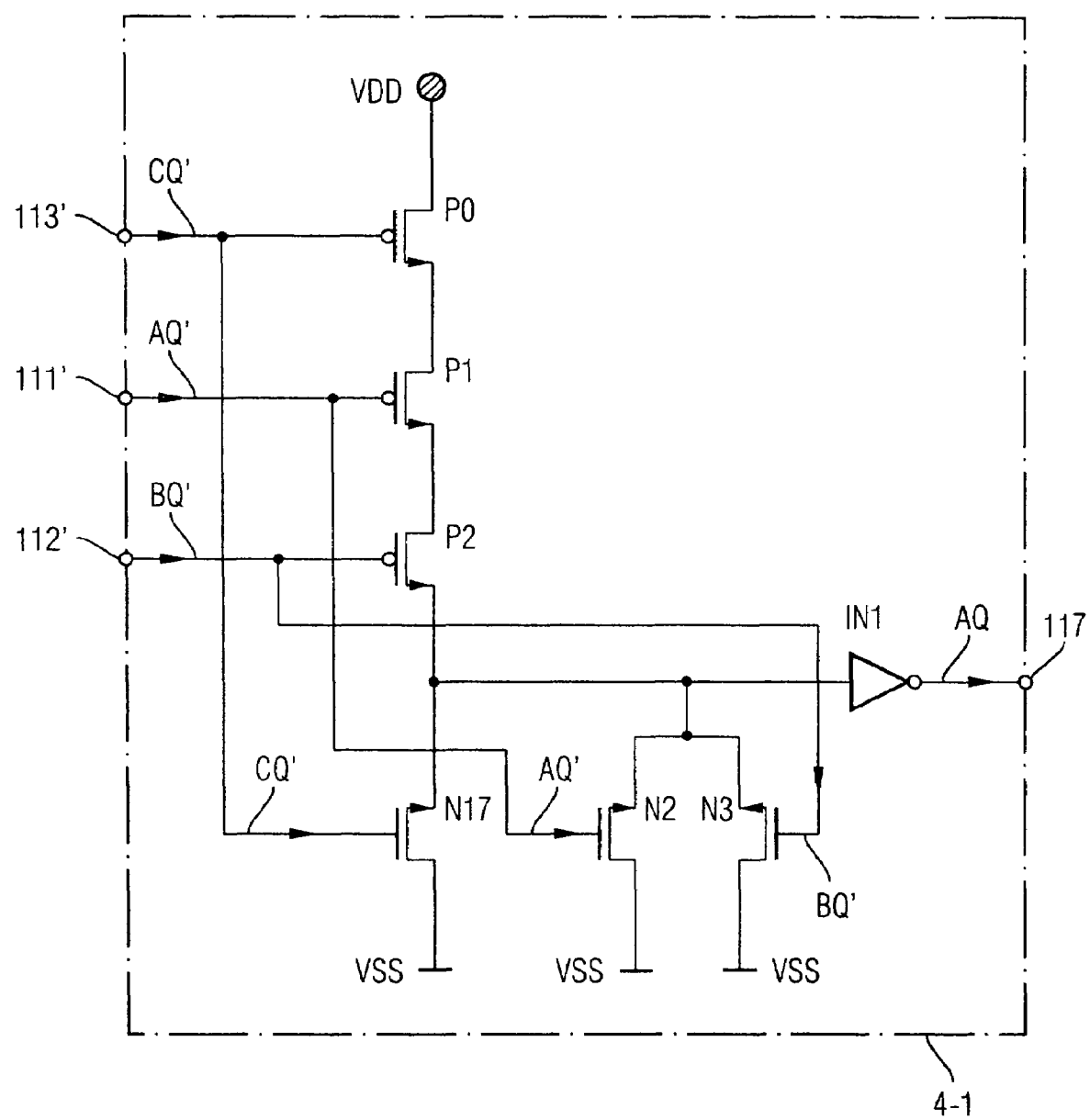
FIGS. 5*a-c:* show a preferred embodiment of the sorting circuit.
Figure 5B:
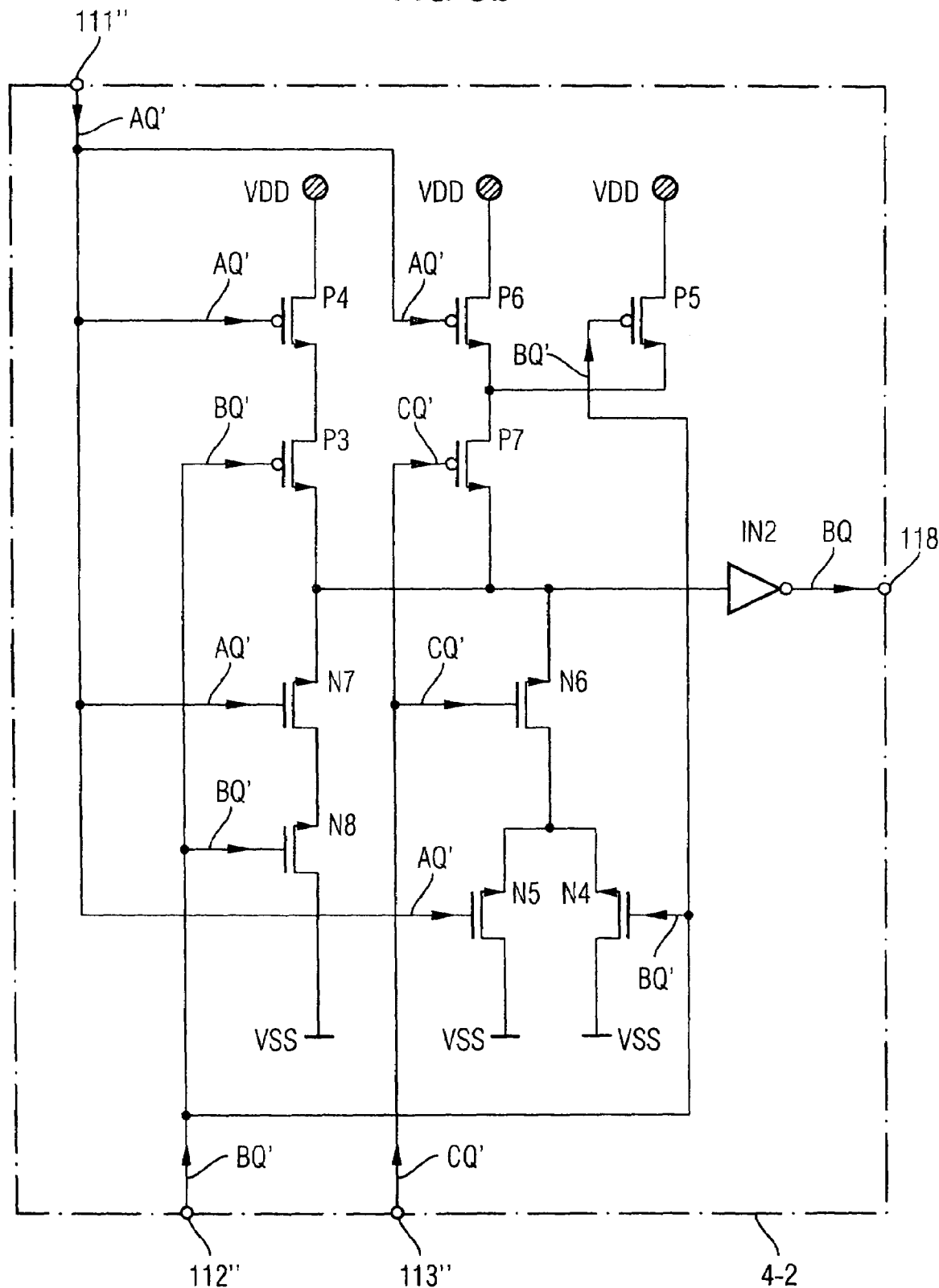
Figure 5C:
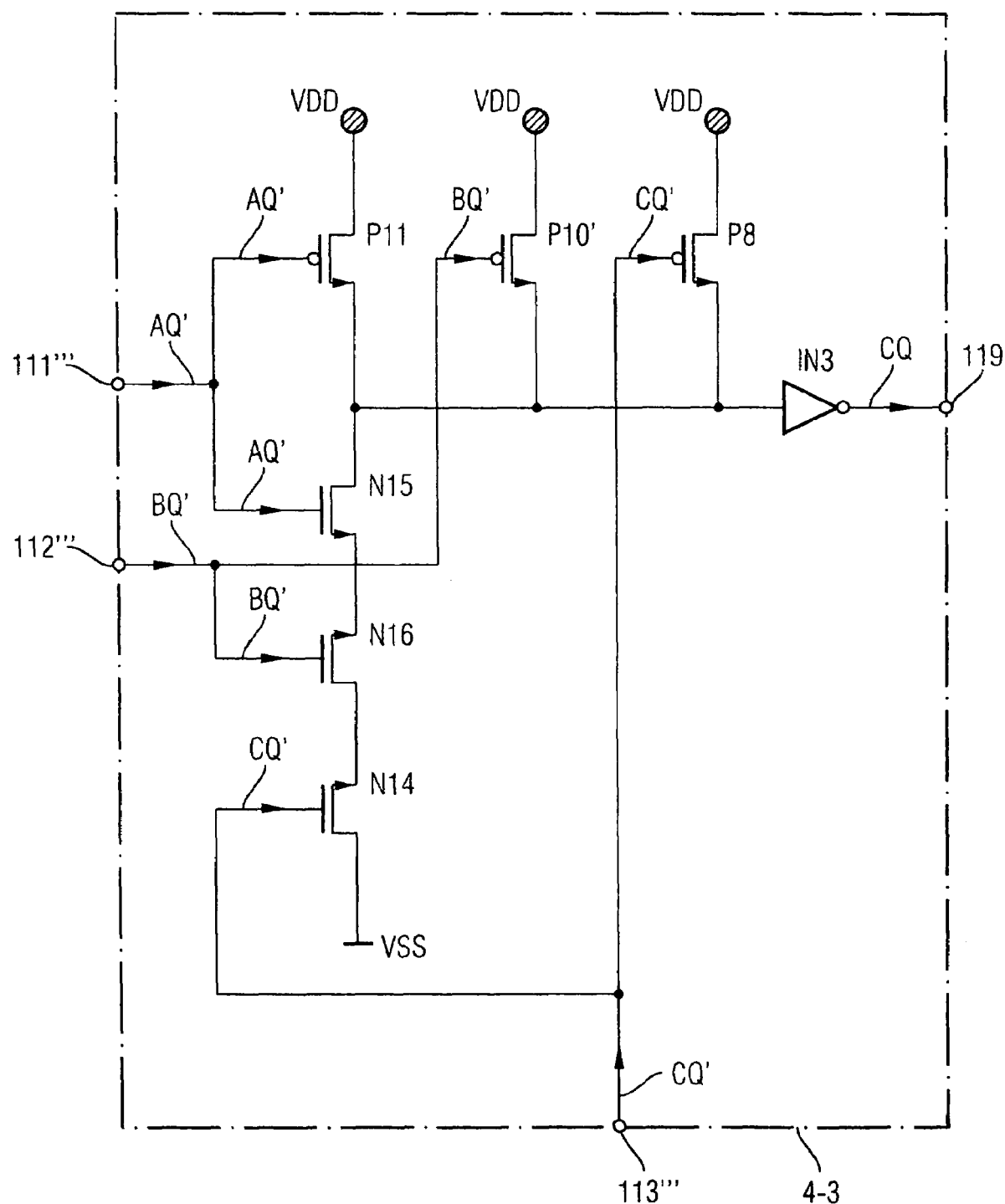

FIG. 5a shows a preferred embodiment of the first circuit block 4-1 of the sorter; FIG. 5b shows the second circuit block 4-2 of the sorter 4, and FIG. 5c shows the third circuit block 4-3 of the sorter 4. The three circuit blocks 4-1, 4-2, 4-3 of the sorter 4 have a number of controllable switches and logic inverter stages which are connected to one another as shown in the circuits in FIGS. 5a-c.

Figure 6:
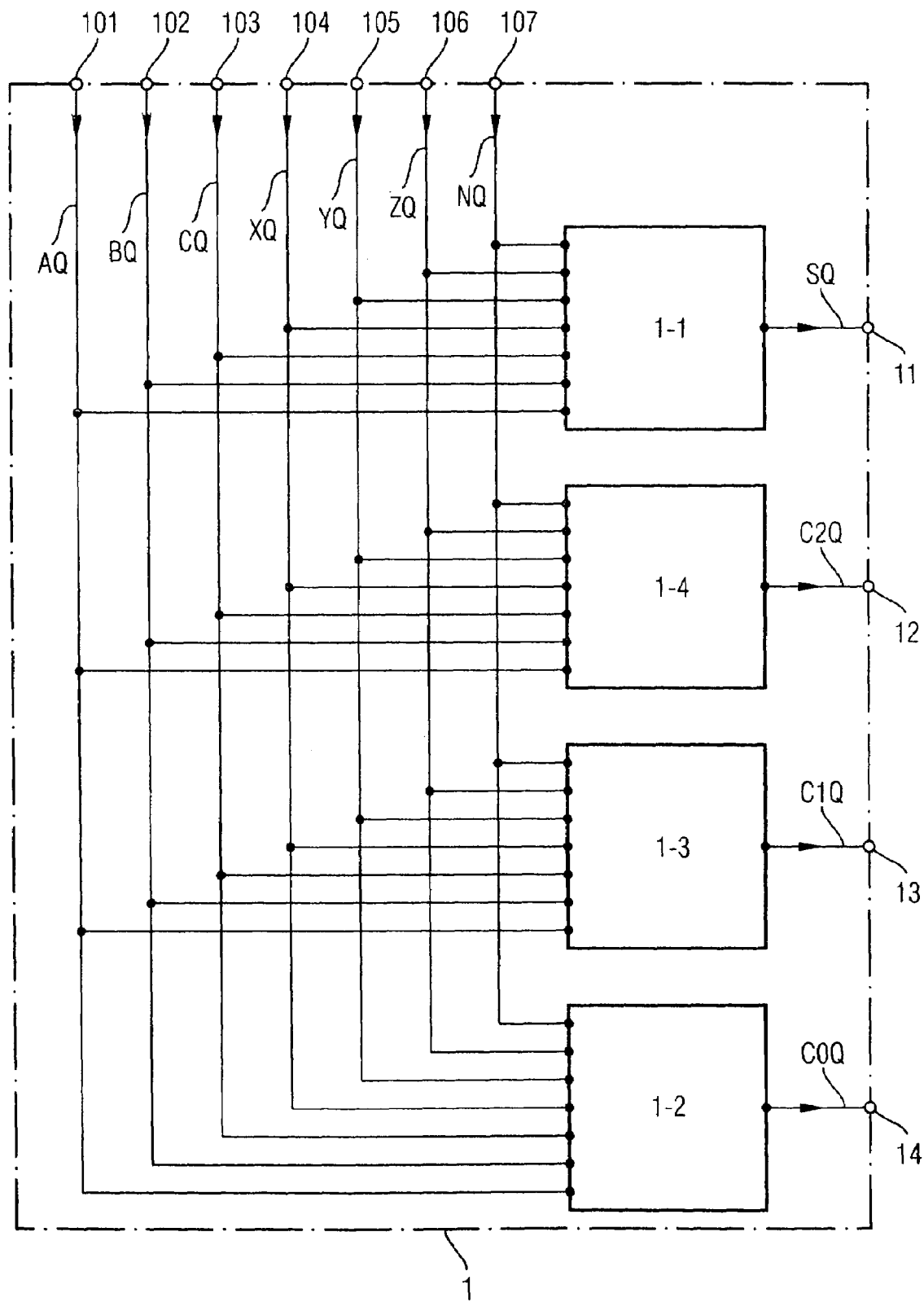
FIG. 6: shows a block diagram of the inventive adder.
Figure 7A:
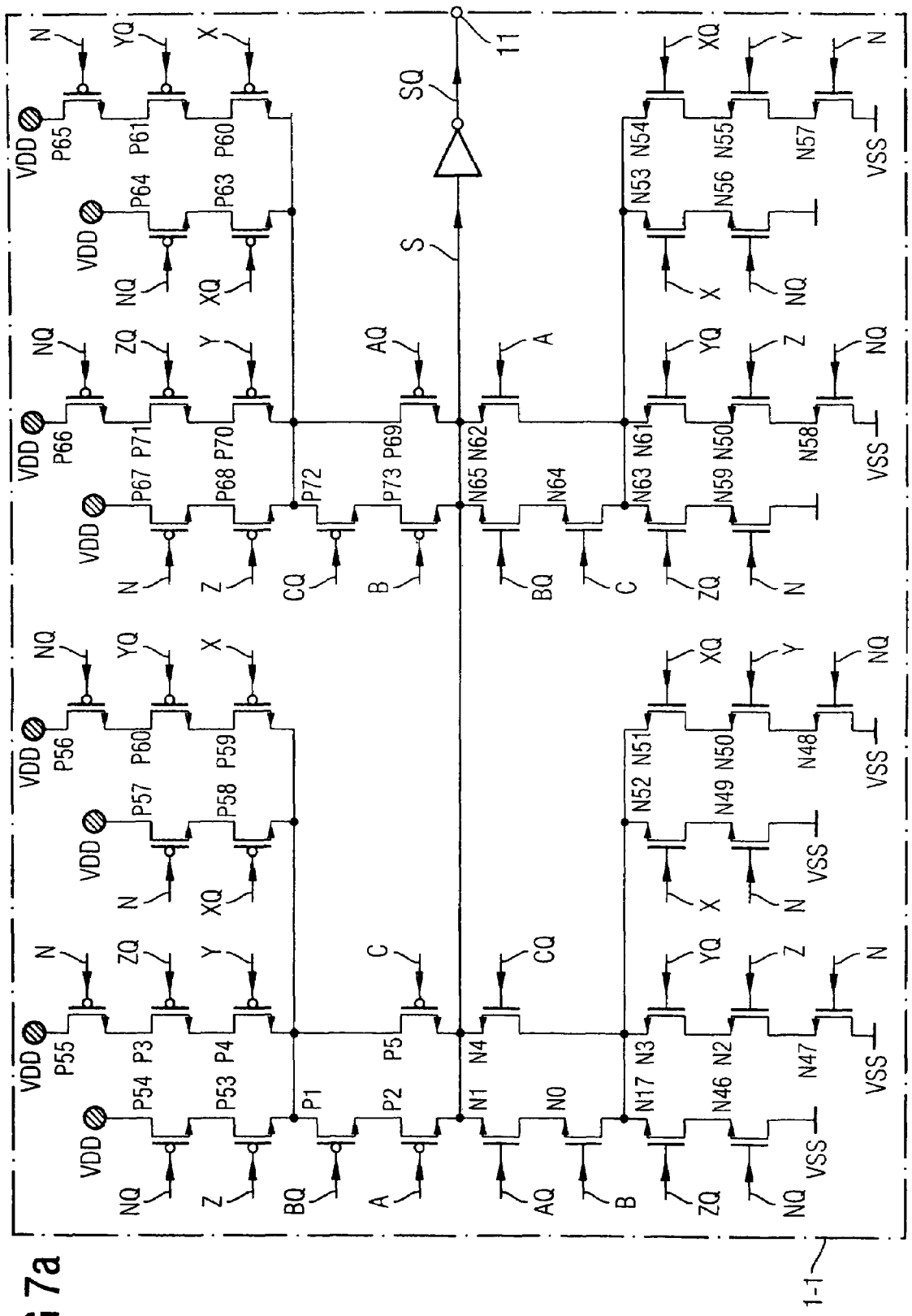
Figure 7B:
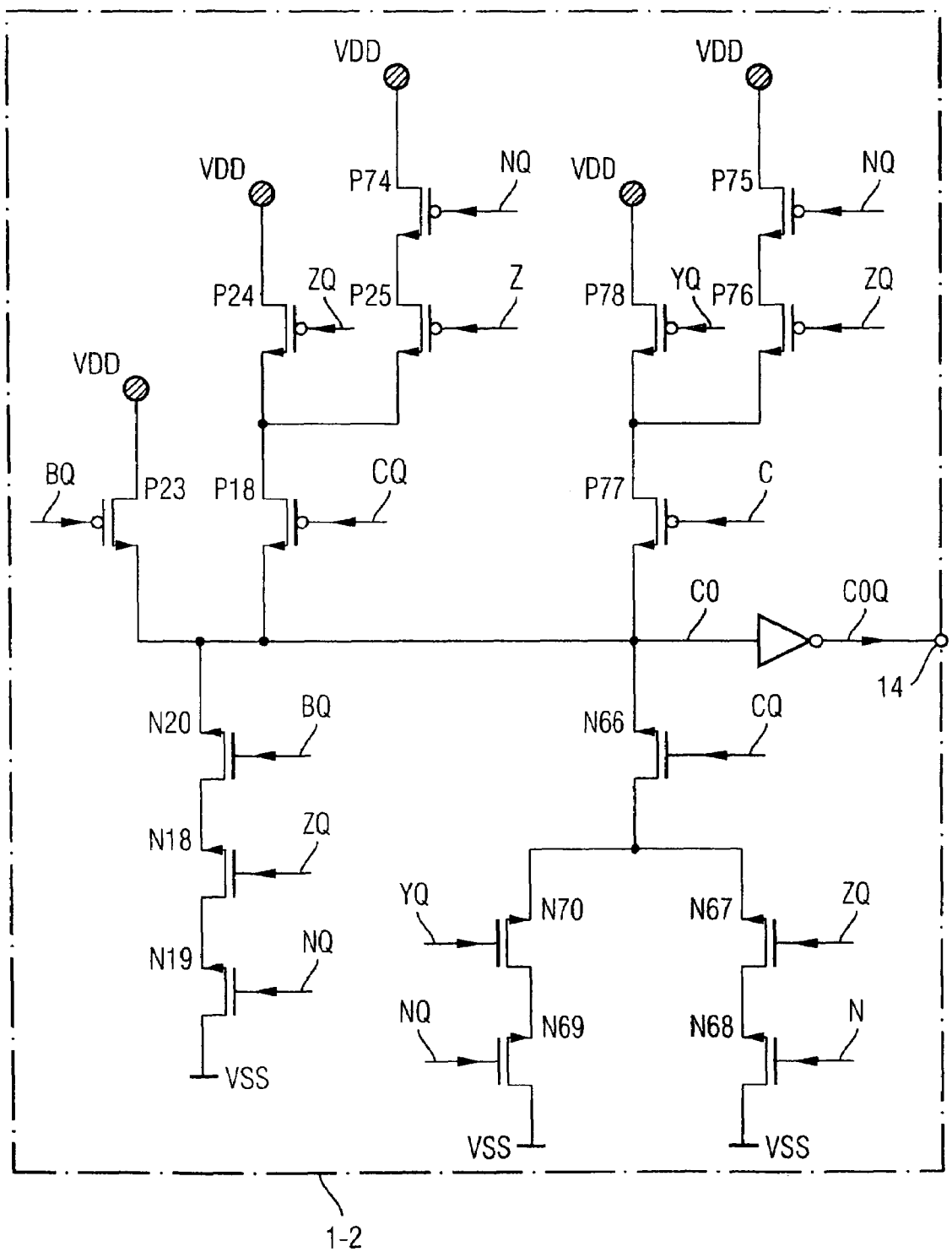
Figure 7C:
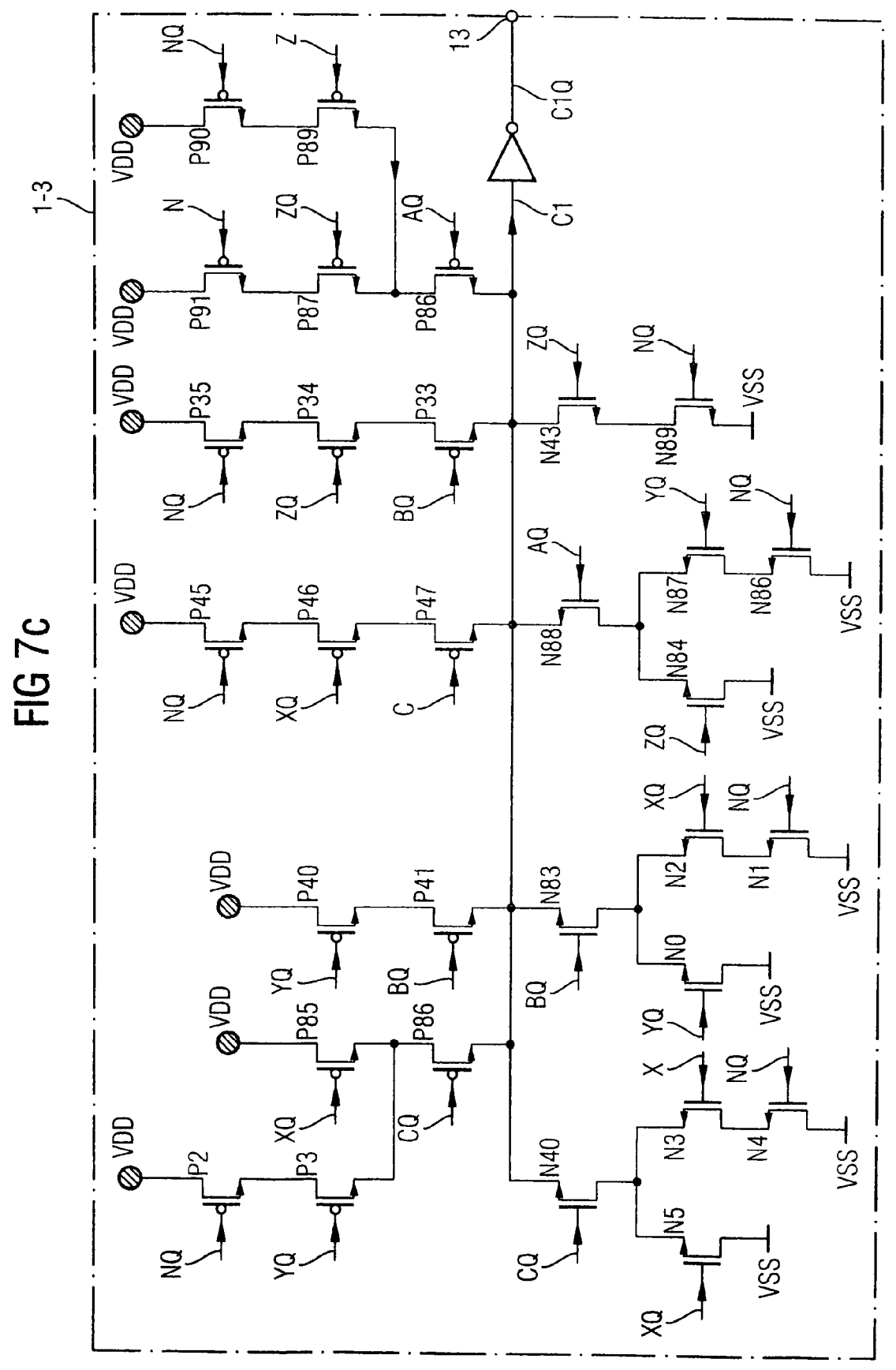
Figure 7D:
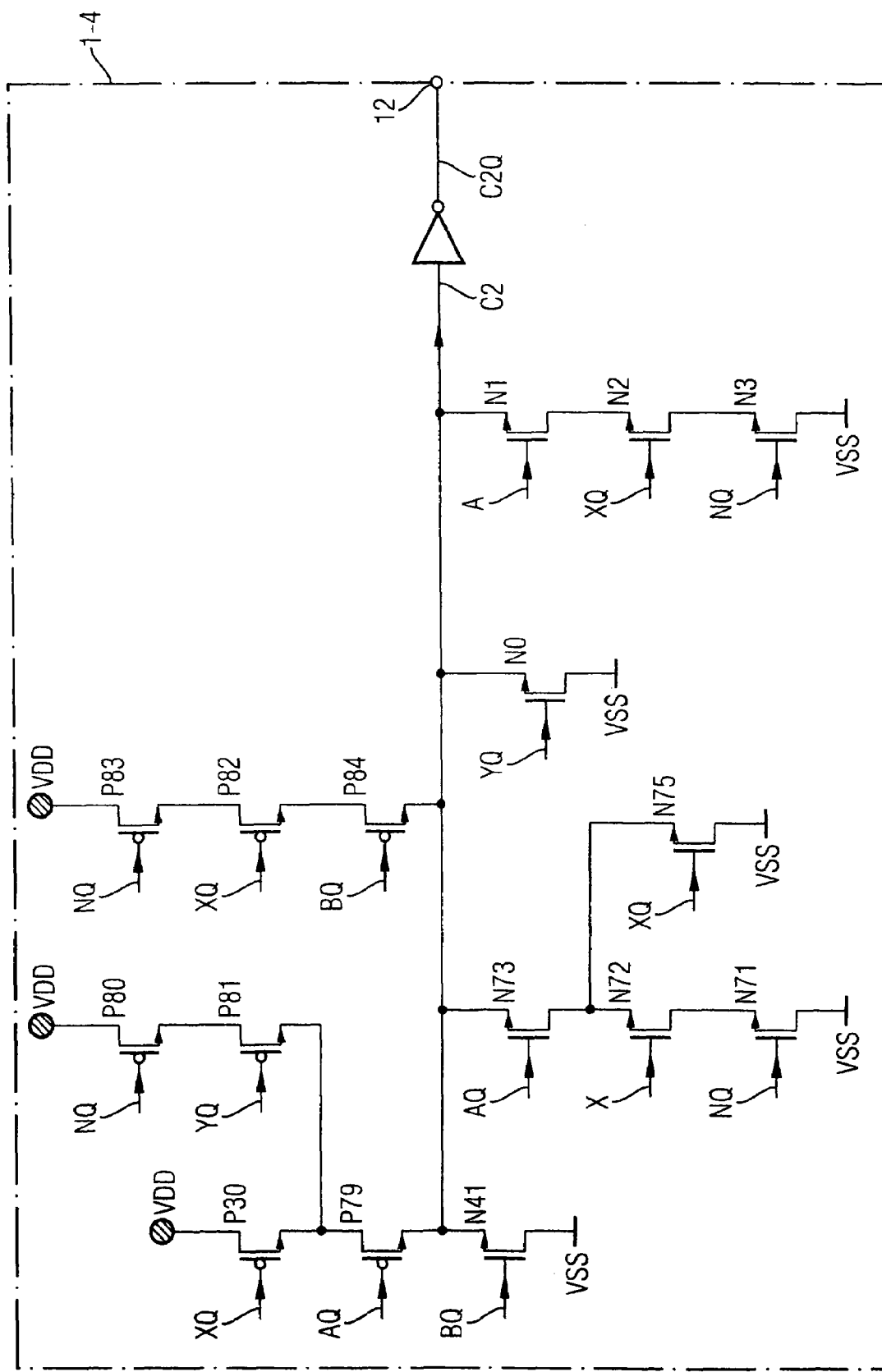

FIG. 6 shows a block diagram of the inventive adder 1 having seven inputs 101-107 to which the seven presorted bits AQ, BQ, CQ, XQ, YQ, ZQ, NQ to be added are applied, an output 11 for outputting the sum bit SQ and three outputs 12, 13, 14 for outputting the carry bits C0Q, C1Q, C2Q. The inventive adder 1 also has four circuit blocks 1-1, 1-2, 1-3, 1-4 which are each coupled to the seven inputs 101-107, with the result that the seven sorted bits AQ, BQ, CQ, XQ, YQ, ZQ, NQ to be added are applied to each circuit block. The first circuit block 1-1 supplies the sum bit SQ to the output 11 of the adder. The second circuit block 1-2 supplies the first carry bit C0Q to the output 14, the third circuit block 1-3 supplies the second carry bit C1Q to the output 13 and the fourth circuit block supplies the third carry bit C2Q to the output 12 of the adder 1. FIGS. 7a-d show preferred embodiments of the circuit blocks 1-1, 1-2, 1-3, 1-4 of the adder.

The circuit arrangements 1-1, 1-2, 1-3, 1-4 of the circuit blocks in the adder 1 have a multiplicity of controllable paths and inverter stages which are connected to one another in accordance with the circuits shown in FIGS. 7a-d. In this case, the reference symbols A, B, C, N, X, Y, Z, S, C0, C1, C2 denote the inverted signals corresponding to the references AQ, BQ, CQ, NQ, XQ, YQ, ZQ, SQ, C0Q, C1Q, C2Q. It will be understood that the inverted signals are generated by interposing inverter stages. In the circuit implementation of the inventive adder 1 shown in FIGS. 7a-d, there are a maximum of five controllable paths between one of the outputs 11-14 and a supply connection VDD, VSS. As a result of this particularly low number of controlled paths of controllable switches, the preferred embodiment of the inventive adder 1 is particularly fast and has a low power consumption.

Although the present invention has been described above with reference to a particular embodiment, it is not restricted thereto but rather can be modified multifariously.

The invention is thus not restricted to the special circuit design of the sorting circuit or adder shown above figures. Rather, just this circuit arrangement can be modified without departing from the fundamental principle of the invention. In particular, other circuit implementations of the addition table shown in FIG. 2 are conceivable.

The invention claimed is:

1. An adder having a high switching speed and reduced power consumption, the adder operable to add at least four bits of the same significance w, said adder comprising:
   a presorting unit configured to generate logic levels corresponding to the at least four bits in a presorted form;
   a first number of inputs configured to receive input signals having the logic levels corresponding to the at least four bits in the presorted form;
   a second number of outputs configured to generate output signals having output logic levels; and
   at least one logic element coupled between the first number of inputs and the second number of outputs, the at least one logic element configured in circuit hardware to add the at least four bits based on the presorted form to generate the output logic levels.

2. The adder according to claim 1, wherein the second number of outputs is operable to generate the output signals such that they represent a parity and a carry of the added at least four bits.

3. The adder according to claim 1, wherein the first number of inputs is configured to receive input signals having logic levels that correspond to at least six bits of equal significance, and wherein the second number of outputs includes at least three outputs.

4. The adder according to claim 1, wherein the at least one logic element is further operable to generate a sum bit of significance w and provide the sum bit to a first output of the second number of outputs.

5. The adder according to claim 4, wherein the at least one logic element is further operable to generate carry bits of significance 2w and 4w, and provide the carry bits to, respectively, second and third outputs of the second number of outputs.

6. The adder according to claim 4, wherein the at least one logic element is further operable to generate a plurality of carry bits of significance 2w, and provide each of the plurality of carry bits to a corresponding one of a second output, a third output and a fourth output of the second number of outputs.

7. The adder according to claim 6, wherein the at least one logic element is further operable to generate logic levels at the second, third and fourth outputs in such a manner that the same logic levels are applied at least to two adjacent outputs of the second number of outputs.

8. The adder according to claim 1, wherein said presorted form includes a form in which in all cases at least two adjacent inputs of three adjacent inputs have input signals at the same logic levels.

9. The adder according to claim 1, wherein:
   the first number of inputs includes three first inputs and three second inputs, the first inputs configured to receive input signals having logic levels corresponding to three bits of the at least four bits in presorted form such that at least two adjacent of the three bits have the same logic levels, the second inputs configured to receive input signals having logic levels corresponding to three other bits of the at least four bits in presorted form such that at least two adjacent of the three other bits have the same logic levels.

10. The adder according to claim 9, wherein the first number of inputs includes a further input configured to receive an input signal having a logic level corresponding to a further bit of the at least four bits.

11. The adder according to claim 1, wherein the adder comprises a carry-save adder.

12. The adder according to claim 1 wherein the at least one logic element comprises a maximum of five controlled signal paths of controllable switches arranged in series between an output and a supply connection.

13. An adding device having a high switching speed and reduced power consumption, the adding device configured to add at least four bits of the same significance w, the adding device comprising:

a first sorting unit fixedly configured in circuit hardware to presort at least some of the at least four bits in order to reduce the number of possible combinations of the at least four bits such that there are less possible combinations of the at least four bits in presorted form than possible combinations of the at least four bits in non-presorted form;

at least one logic element coupled to receive the at least four bits in presorted form, the at least one logic element fixedly configured in circuit hardware to add the at least four bits based on the presorted form to generate output bits; and a number of outputs operably coupled to receive the output bits from the at least one logic element.

14. The adding device according to claim 13, wherein:

the at least four bits includes at least six bits;

the first sorting unit is operable to presort three of the at least six bits; and further comprising a second sorting unit operable to presort three others of the at least six bits.

15. The adding device according to claim 13, wherein the at least one logic element includes a first adding unit and a second adding unit, the first adding unit configured to add bits of significance w, and the second adding unit configured to add bits of significance 2w, the second adding unit connected in cascade to the first adding unit.

16. The adding device according to claim 15, wherein at least the first adding unit, the second adding unit and the first sorting unit are parts of an integrated circuit.

17. A method of reducing power consumption at a high frequency in adding at least four bits of equal significance, said method comprising:

(a) providing to an adder circuit at least four bits of significance w that are to be added, (b) presorting the at least four bits using a presorting unit, (c) calculating sum and carry information for the at least four bits based on the presorting, (d) outputting from the adder circuit a sum bit, and (e) outputting from the adder circuit at least two carry bits.

18. The method according to claim 17, wherein step b) further comprises presorting at least six bits to be added in such a manner that three first bits of the at least six bits to be added are combined to form a first group.

19. The method according to claim 18, wherein step b) further comprises presorting the at least six bits such that three second bits that are different than the three first bits are combined to form a second group.

20. The method according to claim 19, wherein step b) further comprises, for each of the first and second groups, assigning eight combinations of bits to four subgroups, with combinations of three bits that result in the same sum being assigned to the same subgroups.

21. The method according to claim 20, wherein step c) further comprises using the subgroups to calculate the sum and carry information.

22. The method according to claim 17, wherein step e) further comprises outputting three carry bits of significance 2w.

* * * * *